United States Patent [19]

Van Der Plas et al.

[11] Patent Number: 5,015,602
[45] Date of Patent: May 14, 1991

[54] METHOD OF MANUFACTURING A SEMICONDUCTOR DEVICE HAVING A PLANARIZED CONSTRUCTION

[75] Inventors: Paulus A. Van Der Plas; Reinier De Werdt, both of Eindhoven, Netherlands

[73] Assignee: U.S. Philips Corporation, New York, N.Y.

[21] Appl. No.: 522,490

[22] Filed: May 10, 1990

Related U.S. Application Data

[63] Continuation of Ser. No. 219,518, Jul. 15, 1988, abandoned.

[30] Foreign Application Priority Data

Jul. 21, 1987 [NL] Netherlands ............. 8701717

[51] Int. Cl.$^5$ ............... H01L 21/31; H01L 21/76
[52] U.S. Cl. ................. 437/67; 437/228; 437/978; 437/78; 156/653
[58] Field of Search ......... 437/225, 228, 195, 981, 437/67, 78, 203, 978; 156/643, 651, 653, 657

[56] References Cited

U S. PATENT DOCUMENTS

| | | | |
|---|---|---|---|
| 3,976,524 | 8/1976 | Feng | 148/DIG. 105 |
| 4,038,110 | 7/1977 | Feng | 437/978 |
| 4,199,384 | 4/1980 | Hsu | 437/978 |
| 4,470,874 | 9/1984 | Bartush et al. | 156/653 |
| 4,481,070 | 11/1984 | Thomas et al. | 156/651 |
| 4,541,169 | 9/1985 | Bartush | 156/643 |
| 4,545,852 | 10/1985 | Barton | 156/643 |
| 4,605,470 | 8/1986 | Gwozdz et al. | 156/643 |
| 4,634,496 | 1/1987 | Mase et al. | 437/978 |
| 4,662,064 | 5/1987 | Hsu et al. | 437/195 |
| 4,708,767 | 11/1987 | Bril | 437/18 |
| 4,836,885 | 6/1989 | Breiten et al. | 437/67 |

FOREIGN PATENT DOCUMENTS

| | | | |
|---|---|---|---|
| 0200525 | 11/1986 | European Pat. Off. | 437/947 |
| 3228399 | 2/1984 | Fed. Rep. of Germany | 437/978 |
| 1-30243 | 2/1989 | Japan | 437/67 |
| 2160359 | 12/1985 | United Kingdom | 437/978 |

OTHER PUBLICATIONS

Sze, S. M. *VLSI Technology*, McGraw Hill, 1983, pp. 106-111.

*Primary Examiner*—Brian E. Hearn
*Assistant Examiner*—T. N. Quach
*Attorney, Agent, or Firm*—Paul R. Miller

[57] ABSTRACT

A method of manufacturing a semiconductor device, in which a depression (1,2,3) in a surface (4) of a semiconductor substrate (5) is filled by covering it with a preplanarized filling layer (8,19,22) and a further planarization layer (9), after which the substrate (5) is brought into contact with an etchant, in which both layers (8,19,22) and (9) are etched at substantially the same rate. According to the invention, the preplanarized filling layer (8,19,22) is formed by covering the surface (4) with a layer of filling material (6) and then removing it beside the depression (1,2,3) over part of its thickness. Thus, the depression (1,2,3) is filled homogeneously in a comparatively simple manner with material of the filling layer (6).

18 Claims, 3 Drawing Sheets

METHOD OF MANUFACTURING A SEMICONDUCTOR DEVICE HAVING A PLANARIZED CONSTRUCTION

This is a continuation of application Ser. No. 219,518, filed July 15, 1988 now abandoned.

BACKGROUND OF THE INVENTION

The invention relates to a method of manufacturing a semiconductor device, in which a depression in a surface of a semiconductor substrate is filled by covering it with a preplanarized filling layer and a further planarization layer, after which the substrate is brought into contact with an etchant, in which the planarization layer and the preplanarized filling layer are etched at substantially the same rate.

The depression in the surface of the semiconductor substrate may be a groove etched into the substrate, but may also be a space located between conductor tracks (for example of aluminium or of polycrystalline silicon) disposed on the substrate, or it may be a window provided in an isolating layer. The etching treatment with the etchant in which the planarization layer and the preplanarized filling layer are etched at practically the same rate, can be stopped at different instants. It may be stopped, for example, at the instant at which the surface of the semiconductor substrate is reached; the depression is then filled, while no filling material is present on the surface beside the depression. Thus, for example, grooves in a silicon surface may be filled with isolating material. Alternatively, a conductor, such as, for example, aluminium, may thus be provided in grooves or in windows in an isolating layer. The etching treatment may also be stopped before the surface of the semiconductor substrate is reached; the depression is then filled, while a layer of the filling material is also present on the surface beside the depression. Thus, for example, conductor tracks may be packed in isolating material. In all these cases, a semiconductor device having a flat planarized construction is obtained.

A method of the kind mentioned in the opening paragraph is known from IBM-TDB, Vol. 25, No. 11 B, 1983, pp. 6129-30, in which a groove in a silicon surface is filled with silicon oxide. The preplanarized filling layer is formed in this case in two processing steps. First the surface is covered with a first silicon oxide layer. Then a photoresist mask is provided at the area of the depression. Subsequently, the part of the first silicon oxide layer not covered with the photoresist mask is etched away. The silicon surface beside the groove is fully exposed. Also silicon oxide is removed from the groove, silicon also being exposed in an edge of the groove. After this etching treatment, the photoresist mask is removed and the surface is covered with a second layer of silicon oxide. Thus, the depression in the surface of the semiconductor substrate is filled with a comparatively flat preplanarized layer. Due to the second silicon oxide layer, not the whole groove, but only the edge thereof need be filled, at which during the etching treatment silicon oxide of the first layer was etched away. Since now considerably smaller spaces have to be filled, the second silicon oxide layer has comparatively flat surface.

Besides the fact that in the known method described two depositions of silicon oxide are required, this method has further the disadvantage that during the second deposition the very small spaces at the edge of the depression have to be filled. In order to avoid that cavities are formed in the layer, a deposition process has to be used with a very good step coverage or a silicon oxide layer must be provided which liquefies during a heat treatment then additionally to be carried out, any cavities present then disappearing. In the last-mentioned case, the silicon oxide must contain a comparatively large amount of additions, such as boron or phosphorus. This may be very objectionable because during the heat treatment for liquefying the silicon oxide layer this addition can diffuse into the underlying and adjacent silicon. Semiconductor zones doped in an undesired manner can then be formed in the silicon or zones already present therein can assume undesired properties.

The invention has inter alia for its object to obviate these disadvantages.

SUMMARY OF THE INVENTION

According to the invention, this method is for this purpose characterized in that the preplanarized filling layer is constituted by covering the surface with a layer of filling material and by then etching it away beside the depression over part of its thickness.

A single deposition is sufficient to provide the preplanarized filling layer. Since the layer of filling material is etched away over only part of its thickness, the depressions remain covered with filling material throughout their surface. At the edges of the depressions no spaces are formed, in which the underlying substrate is exposed. Since the depressions are comparatively large, it is comparatively simple to fill the depressions. Therefore, less stringent requirements need be imposed on the step coverage of the deposition process to be used. Further, the filling material need not contain further additions, as a result of which it would readily liquefy during an additional heat treatment. This additional heat treatment can be omitted. An undesired doping of the underlying and adjacent substrate is thus also counteracted.

A flat preplanarized layer is obtained if according to the invention the process of etching the layer of filling material is continued until the layer of filling material has reached beside the depressions practically the same level as at the area of the depressions.

In practice, this can be realized in a very simple manner if according to the invention the layer of filling material is formed with a top layer which can be selectively etched away and has a thickness substantially equal to the depth of the depression. The term "top layer which can be selectively etched away" is to be understood to mean herein a top layer which can be etched away in such a manner that the part of the filling layer located below the top layer is practically not attacked or that it can readily be ascertained by an end point detection that the part of the filling layer located below the top layer is reached. In the second case, the etching treatment must then be stopped. If the top layer of the layer of filling material beside the depression is removed, this layer is found in practice to have reached just the same level as at the area of the depression. This can simply be effected in that the filling layer is provided at the area of the depression with an etching mask and in that the substrate is then subjected to an etching treatment, in which parts of the top layer not covered by the etching mask are selectively removed.

Preferably, the top layer according to the invention is provided on an intermediate layer that can be selectively etched. The top layer can then be selectively etched away from the intermediate layer, which in turn can be selectively etched away from a subjacent layer of the filling layer located below the intermediate layer. The filling layer in this case consequently consists of three sublayers: the top layer, the intermediate layer and the base layer. After a preplanarization, in which the top layer beside the depression is removed, the preplanarized filling layer consists of adjacent parts of the top layer (above the depression) and the base layer (beside the depression). Since these parts are made of the same material, the next planarization treatment—in which a planarization layer is formed—can be carried out without difficulty. If on the substrate regions of different materials are located beside each other, this may give rise to etching inhomogeneities. If, for example, regions of photoresist and silicon oxide are located beside each other, the rate at which the photoresist is etched strongly depends upon the size of the adjacent silicon oxide region. If many of these regions of different size are located beside each other on the substrate, the etching rate will be different from place to place so that an inhomogeneous etching process is obtained. This is not the case in the method according to the invention, the less so as the comparatively thin intermediate layer beside the depression is removed before the further planarization treatment.

Preferably, according to the invention, during the step of etching the layer of filling material a photoresist mask is used having transverse dimensions which are smaller than those of the depressions; viewed in projection, the photoresist mask then lies within the depressions. Thus, a preplanarized layer is obtained, which has grooves above the edges of the depressions. Such a layer is more suitable for further planarization. Parts of the photoresist mask located above the depressions may also have transverse dimensions which are equal to or larger than those of the depressions. After etching, the filling layer will then have embossed parts located above the edges of the depressions. This form is less suitable for further planarization.

If a layer of filling material is provided having an overall thickness at least twice the depth of the depression in the surface, the depression is filled homogeneously after the further planarization has been carried out. Beside the material of the preplanarized filling layer, no material of the further planarization layer is then present in the depressions.

BRIEF DESCRIPTION OF THE DRAWING

The invention will be described more fully, by way of example, with reference to a drawing and an embodiment. In the drawing.

DESCRIPTION OF THE PREFERRED EMBODIMENTS

Figure 1:
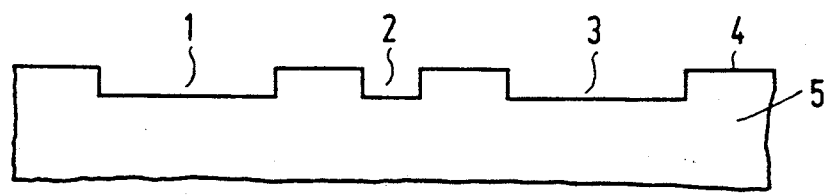
FIGS. 1, 2, 3, 4 and 5 show diagrammatically in cross-section a few successive stages of manufacture of a semiconductor device by means of the method according to the invention.

FIGS. 1 to 5 show diagrammatically and in cross-section a few successive stages of manufacture of a semiconductor device by means of the method according to the invention, in which depressions 1, 2, 3 in a surface 4 of a semiconductor substrate 5 are filled. These depressions may be grooves etched into the substrate, but may also be spaces located between semiconductor tracks disposed on the substrate or windows provided in an isolating layer. The invention will be described hereinafter for grooves 1, 2, 3 etched into a semiconductor substrate 4 of monocrystalline silicon. The depressions 1, 2 and 3 are filled by covering the surface 4 with a filling layer of silicon oxide 6, which is preplanarized by means of a photoresist mask 7 provided at the area of the depressions 1 and 3 to form layer 8. The preplanarized layer 8 is then covered with a further planarization layer 9 of, for example, photoresist HPR 204 of Hunt or with a layer of silicon oxide doped with phosphorus and boron and is then brought into contact with an etchant, in which the planarization layer 9 and the preplanarized filling layer 8 are etched at substantially the same rate.

Figure 5:
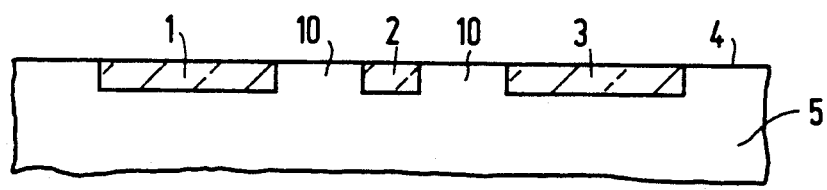

The etching treatment can be stopped at different instants, for example, as indicated in FIG. 5, at the instant at which the surface 4 of the semiconductor substrate 5 is reached. The depressions 1, 2 and 3 are then filled, while on the surface 4 beside the depressions 1, 2 and 3 no filling material is present. If the depressions are filled with isolating material, the filled depressions 1, 2 and 3 can serve as field isolation regions in the semiconductor device. Transistors and other semiconductor elements can then be provided in a usual manner in the silicon regions 10 located between these isolation regions. If the depressions 1, 2 and 3 are grooves or windows in an isolating material, a conductor of aluminium or polycrystalline silicon can thus be provided in these grooves 1, 2 and 3.

Figure 6:
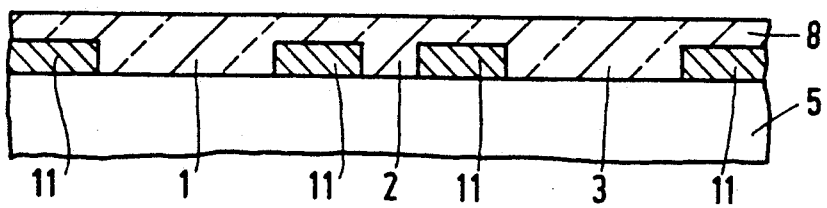
FIGS. 6, 7, 8, 9, 10, 11, 12, 13, 14, 15 and 16 show diagrammatically in cross-section steps which are alternative to steps shown in FIGS. 1 to 5.

The etching treatment can also be stopped before the surface 4 of the semiconductor substrate is reached. In FIG. 6, such a situation is shown. The depressions 1, 2 and 3 are in this case the spaces located between conductor tracks 11 on the substrate 5. The conductor tracks are "packed" in isolating material of the filling layer 8 in this case.

According to the invention, the preplanarized filling layer 8 is formed by covering the surface with a layer of filling material 6 and by then removing it beside the depressions 1, 3 over part of its thickness. The process of obtaining the preplanarized filling layer 8 is thus a comparatively simple process; further, each of the grooves 1, 2 and 3 can be filled homogeneously with only one kind of material.

Preferably, according to the invention, the process of etching the layer of filling material 6 is continued until the latter has reached on the surface 4 beside the depressions 1, 2 and 3 practically the same level 12 as the level 13 at the area of the depressions 1, 2 and 3 at which the photoresist mask 7 is provided. Thus, a comparatively flat preplanarized layer 8 is obtained.

Figure 7:
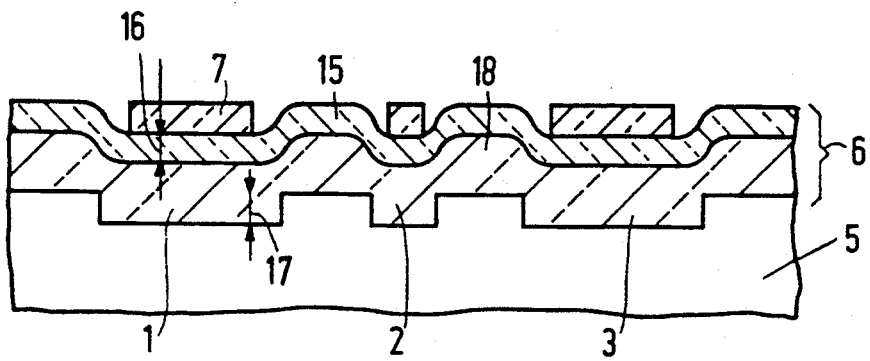
Figure 8:
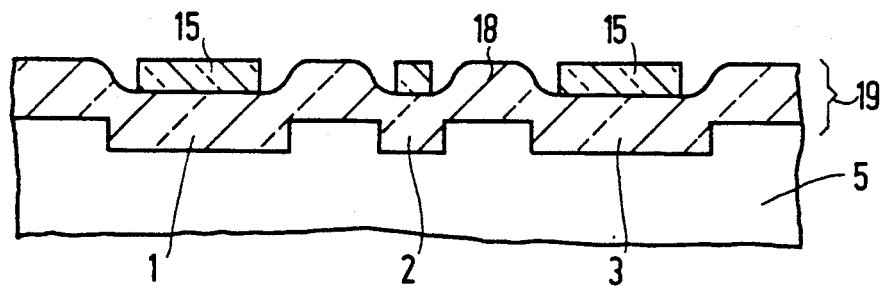

This can be effected in practice in a very simple manner—as indicated in FIGS. 7 and 8—if according to the invention, the layer of filling material 6 is formed with a top layer 15 which can be selectively etched away and has a thickness, indicated by a dimension 16, which is practically equal to the depth of the depressions 1, 2, 3 indicated by a dimension 17. The top layer 15 consisting, for example, of polycrystalline silicon lies on a base layer 18 consisting, for example, of silicon oxide. The top layer 15 can be etched away from the base layer 18 in a usual manner substantially without the base layer 18 being attacked. The top layer 15 may also be etched, until the base layer 18 is reached this being ascertained by an end point detection, after which the etching process is stopped. In the first case, a wet etching treatment may be used, while in the second case a dry etching treatment may be carried out in an etching plasma. After the photoresist mask 7 has been provided, the part of the top layer 15 of the layer of filling material 6 not covered by the photoresist mask 7 is etched away. It appears that the parts beside and above the depressions 1, 3 of the preplanarized filling layer 19 indicated in FIG. 8 are just located at the same level.

Figure 9:
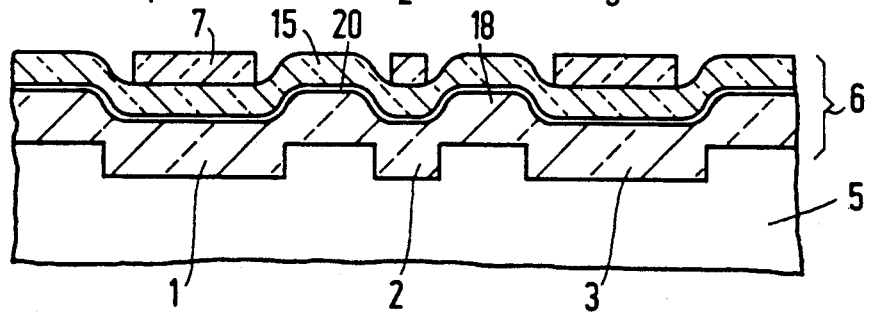
Figure 10:
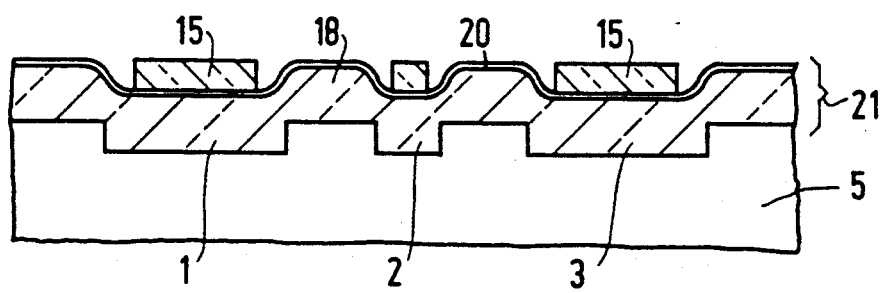
Figure 11:
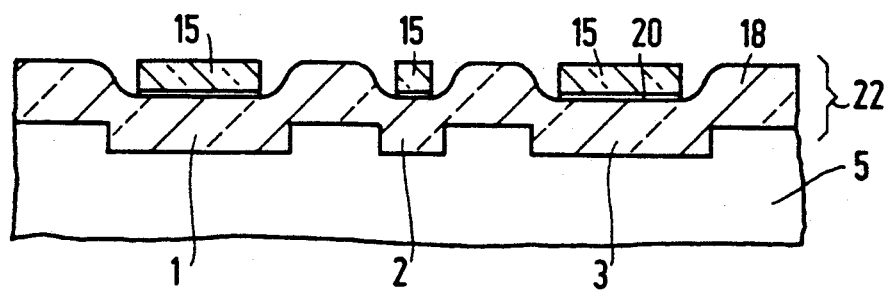
Figure 12:
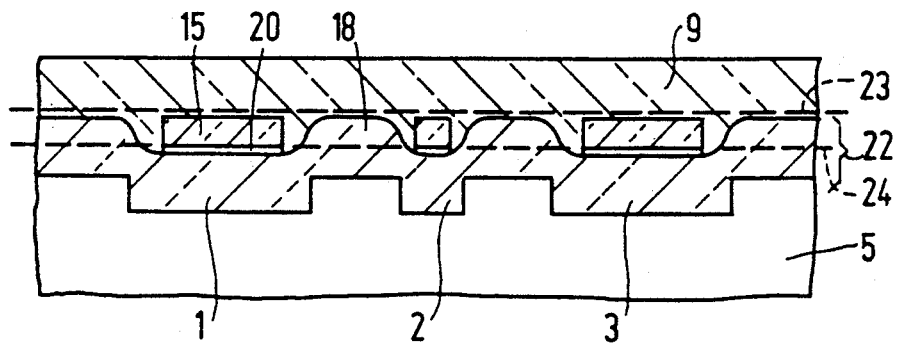

Preferably, the top layer 15 is provided according to the invention—as indicated in FIG. 9—on an intermediate layer 20 which can be selectively etched. The top layer 15 of, for example, silicon oxide can then be selectively etched away from the intermediate layer 20 of, for example, silicon nitride, which in turn can be selectively etched away from the base layer 18 of, for example, silicon oxide. After the parts of the top layer 15 not covered by the photoresist mask 7 have been removed, the preplanarized layer 21 is formed (FIG. 10). If now the uncovered parts of the intermediate layer 20 are also removed, the preplanarized layer 22 has the appearance shown in FIG. 11. This layer 22 consists above and beside the depressions 1, 2, 3 of the same material (which was otherwise also the case with the layer 8 in FIG. 4, but in this case it was much more difficult to stop the etching process in time during the preplanarization). This has the advantage that, if during the further planarization (in which the planarization layer 9 is formed and is etched, this layer 9 being etched practically at the same rate as the filling layer 22) the level indicated by a dotted line 23 is reached (FIG. 12), practically only the same materials have to be etched. This is more the case as the layer 9 also consists of silicon oxide. In such a case, the etching process is effected in a much more homogeneous manner than in the case in which different adjacent materials have to be etched.

Figure 13:
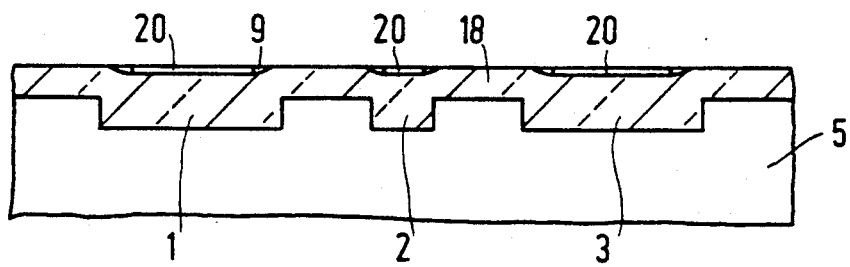
Figure 14:
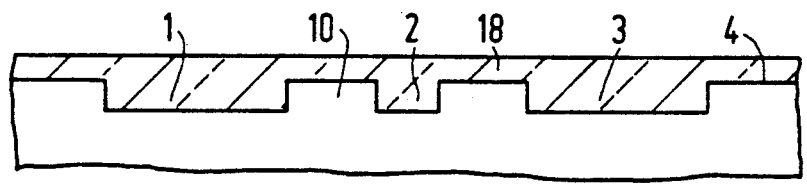

During the etching process in the further planarization treatment the intermediate layer 20 can also be used for end point detection; the etching process can be stopped when the level indicated by a dotted line 24 is reached. The situation shown in FIG. 13 is then obtained, or, after the still remaining parts of the intermediate layer 20 have been removed, the situation shown in FIG. 14 is obtained. The situation shown in FIG. 14, in which filling material of the base layer 18 is still present also on the surface 4 beside the depressions, can be entirely realized by means of dry etching in plasma or with reactive ions. If now the etching treatment is continued in an etching bath, the flat structure shown in FIG. 5 can be obtained, the silicon regions not having been damaged during the dry treatment. During this treatment they were protected by the base layer 18. The base layer 18 must for this purpose be slightly thicker than the depth 17 of the depressions 1, 2, 3.

Figure 2:
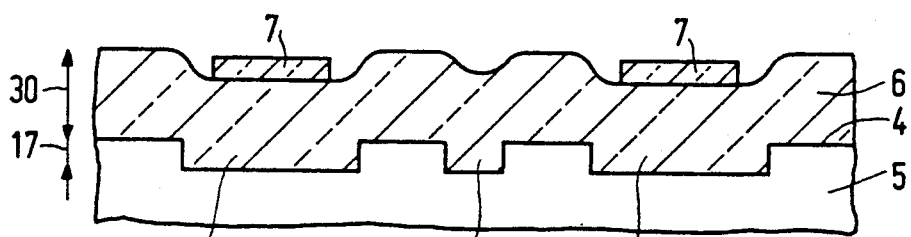
Figure 3:
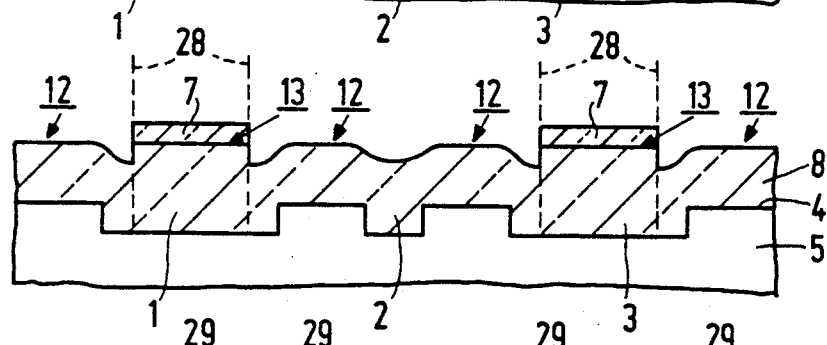
Figure 4:
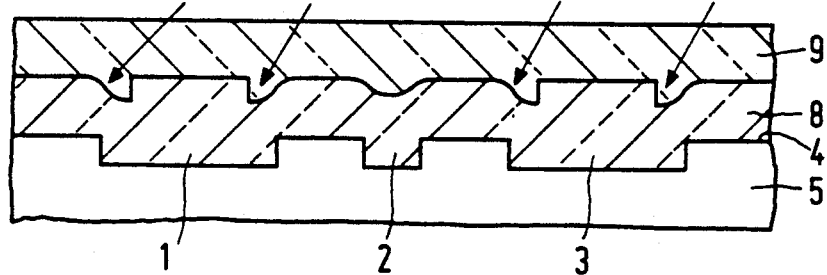
Figure 15:
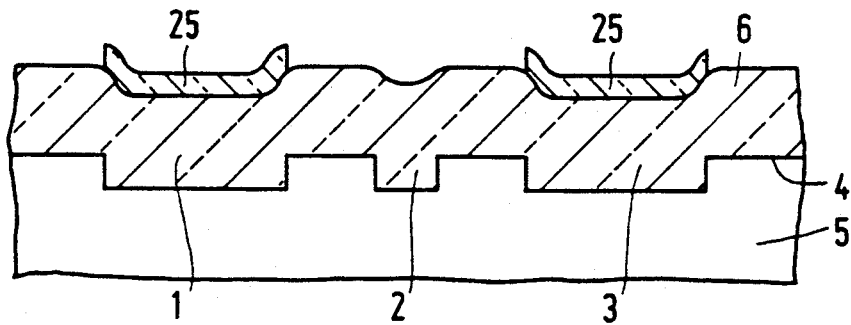
Figure 16:
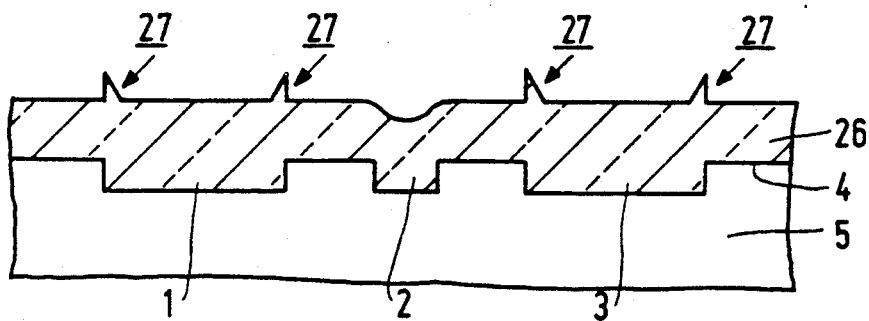

As is indicated in FIGS. 15 and 16, the parts of the photoresist mask 25 located above the depressions 1 and 3 can have transverse dimensions equal to or larger than those of the depressions. After the etching process, the preplanarized layer 26 will then have embossed parts 27 above the edges of the depressions 1 and 3. Preferably, according to the invention and as indicated in FIG. 2, during the process of etching the layer of filling material 6 a photoresist mask 7 is used having transverse dimensions smaller than those of the depressions 1 and 3. The photoresist mask 7 then lies, viewed in projection, within the depressions 1 and 3, as indicated by dotted lines 28 (FIG. 3). Thus, a preplanarized layer 8 is obtained, which has grooves 29 (FIG. 4) above the edges of the depressions 1 and 3. Such a layer is more suitable for further planarization.

In practice, the photoresist mask 7 need be provided only above the depressions 1 and 3, within which the layer of filling material 6 has a substantially flat surface 19 (FIG. 8). These depressions are in practice depressions having comparatively large transverse dimensions (for example larger than $3 \times 3$ $\mu$m). Such large depressions can be filled only with difficulty in planarized form without the use of further means in a usual manner by means of a single planarization layer and an etching treatment. With small depressions (for example of about $1 \times 1$ $\mu$m), such as, for example, the depression 2 in the Figures, this can be effected satisfactorily, however. The depression 2 is filled by means of the planarization layer 9 and the etching treatment to be carried out after this layer has been provided. A satisfactory planarization is then obtained. It is therefore practical and simple to preplanarize the filling layer 6 only at the area of the comparatively large depressions 1 and 3.

The single layer of filling material 6 as shown in FIG. 2 is provided in a thickness which is indicated by a dimension 30 and is at least twice the depth of the depressions 1, 2 and 3 in the surface indicated by a dimension 17. After the further planarization, the depressions 1, 2 and 3 are then filled homogeneously with filling material. In the depressions 1, 2 and 3, only material of the filling layer 6 is present.

The depressions 1, 2 and 3, which in practice have dimensions of more than $0.5 \times 0.5$ $\mu$m, can be filled simply and satisfactorily by covering the surface with a layer of filling material 6 by heating the substrate 5 to a temperature of 600° to 800° C. in a flow of gas comprising only tetraethyl orthosilicate and an inert gas. Thus, the depressions 1, 2 and 3 are filled with silicon oxide, which further does not contain substances which can diffuse into the underlying substrate 5 and can produce there an undesired doping. Phosphorus and boron are often added for filling even smaller depressions. Such a layer follows exactly the surface 4 so that level differences in the layer above and beside the depressions are just equal to the depth of the depressions 1, 2, 3. Preferably, the whole filling layer, but at any rate the base layer—and in the case with the intermediate layer also the top layer—is thus formed.

What is claimed is:

1. A method of manufacturing a semiconductor device comprising the steps of
    (a) forming at least one depression into a semiconductor substrate,
    (b) covering said semiconductor substrate with at least one first layer, said at least one first layer completely filling said at least one depression, and said at least one first layer including a layer of a filling material,
    (c) removing a portion of the thickness of said at least one first layer from said semiconductor substrate,
    (d) covering said at least one first layer with a second layer having a planarized surface, and
    (e) respectively etching said second layer and said at least one first layer at substantially the same etching rate to completely remove said second layer and to at least reduce a substantial thickness of said at least one first layer, and
    wherein step (e) is carried out until said at least one first layer is etched down to said semiconductor substrate.

2. A method according to claim 1, wherein said step (b) is carried out by further forming said at least one first layer with a top layer, said top layer being selectively etchable relative to said layer of filling material, and said top layer having a thickness substantially equal to a depth of said at least one depression.

3. A method according to claim 2, wherein said step (b) is carried out by also forming an intermediate layer between said top layer and said layer of filling material, said intermediate layer being selectively etchable, and said intermediate layer being of the same material as said layer of filling material.

4. A method according to claim 1 wherein a photoresist mask is formed on said at least one first layer before said step (c), said photoresist mask being formed over said at least one depression.

5. A method according to claim 4, wherein said at least one first layer is formed with an overall thickness being at least twice a depth of said at least one depression in said semiconductor substrate.

6. A method according to claim 5, wherein said step (b) is carried out at least in part by heating said substrate to a temperature of 600° to 800° C. and flowing gas including only tetraethyl orthosilicate and an inert gas over said substrate.

7. A method according to claim 4, wherein said step (b) is carried out at least in part by heating said substrate to a temperature of 600° to 800° C. and flowing gas including only tetraethyl orthosilicate and an inert gas over said substrate.

8. A method according to claim 1, wherein said at least one first layer is formed with an overall thickness being at least twice a depth of said at least one depression in said semiconductor substrate.

9. A method according to claim 1, wherein said step (b) is carried out at least in part by heating said substrate to a temperature of 600° to 800° C. and flowing gas including only tetraethyl orthosilicate and an inert gas over said substrate.

10. A method of manufacturing a semiconductor device comprising the steps of
  (a) forming at least one depression into a semiconductor substrate,
  (b) covering said semiconductor substrate with at least one first layer, said at least one first layer completely filling said at least one depression, and said at least one first layer including a layer of a filling material,
  (c) removing a portion of the thickness of said at least one first layer from said semiconductor substrate,
  (d) covering said at least one first layer with a second layer having a planarized surface, and
  (e) respectively etching said second layer and said at least one first layer at substantially the same etching rate to completely remove said second layer and to at least reduce a substantial thickness of said at least one first layer, and
  wherein step (e) is carried out until said second layer is removed and said at least one first layer is etched to a distance above said semiconductor substrate.

11. A method according to claim 10, wherein said step (b) is carried out by further forming said at least one first layer with a top layer, said top layer being selectively etchable relative to said layer of filling material, and said top layer having a thickness substantially equal to a depth of said at least one depression.

12. A method according to claim 11, wherein said step (b) is carried out by also, forming an intermediate layer between said top layer and said layer of filling material, said intermediate layer being selectively etchable, and said intermediate layer being of the same material as said layer of filling material.

13. A method according to claim 10, wherein a photoresist mask is formed on said at least one first layer before said step (c), said photoresist mask being formed over said at least one depression.

14. A method according to claim 13, wherein said at least one first layer is formed with an overall thickness being at least twice a depth of said at least one depression in said semiconductor substrate.

15. A method according to claim 14, wherein said step (b) is carried out at least in part by heating said substrate to a temperature of 600° to 800° C. and flowing gas including only tetraethyl orthosilicate and an inert gas over said substrate.

16. A method according to claim 13, wherein said step (b) is carried out at least in part by heating said substrate to a temperature of 600° to 800° C. and flowing gas including only tetraethyl orthosilicate and an inert gas over said substrate.

17. A method according to claim 10, wherein said at least one first layer is formed with an overall thickness being at least twice a depth of said at least one depression in said surface.

18. A method according to claim 10, wherein said step (b) is carried out at least in part by heating said substrate to a temperature of 600° to 800° C. and flowing gas including only tetraethyl orthosilicate and an inert gas over said substrate.

* * * * *